(12) United States Patent
Choi

(10) Patent No.: US 7,499,357 B2
(45) Date of Patent: Mar. 3, 2009

(54) SEMICONDUCTOR MEMORY DEVICE

(75) Inventor: Young-Geun Choi, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/819,787

(22) Filed: Jun. 29, 2007

(65) Prior Publication Data
US 2008/0080279 A1 Apr. 3, 2008

(30) Foreign Application Priority Data
Sep. 29, 2006 (KR) ........................ 10-2006-0096527

(51) Int. Cl.
G11C 7/00 (2006.01)

(52) U.S. Cl. .................................... 365/203
(58) Field of Classification Search .................. 365/203
See application file for complete search history.

(56) References Cited

U.S. PATENT DOCUMENTS

| 4,906,914 | A  | * | 3/1990  | Ohsawa ........................ 323/314 |
| 5,258,950 | A  | * | 11/1993 | Murashima et al. .... 365/189.05 |
| 5,499,211 | A  | * | 3/1996  | Kirihata et al. ............. 365/203 |
| 6,009,022 | A  | * | 12/1999 | Lee et al. ................. 365/189.09 |
| 6,181,610 | B1 | * | 1/2001  | Shiga ...................... 365/189.05 |
| 6,205,069 | B1 |   | 3/2001  | Kim |
| 6,356,494 | B2 |   | 3/2002  | Jang et al. |
| 6,529,423 | B1 |   | 3/2003  | Yoon et al. |
| 6,532,167 | B2 | * | 3/2003  | Kaneko et al. ............... 365/149 |
| 6,952,377 | B2 |   | 10/2005 | Chung |
| 7,009,899 | B2 |   | 3/2006  | Lee |
| 2002/0110017 | A1 | * | 8/2002 | Kaneko et al. ............... 365/149 |
| 2003/0095430 | A1 | * | 5/2003 | Origasa et al. ............... 365/150 |
| 2005/0276134 | A1 | * | 12/2005 | Mori et al. .................... 365/203 |

FOREIGN PATENT DOCUMENTS

| JP | 9-074337 | 3/1997 |
| JP | 2003-022676 | 1/2003 |
| KR | 10-2006-0082978 A | 7/2006 |

OTHER PUBLICATIONS

Korean Office Action, with English translation, issued in Korean Patent Application No. KR 2006-0096527, mailed Aug. 20, 2007.

* cited by examiner

Primary Examiner—Huan Hoang
Assistant Examiner—Jay Radke
(74) Attorney, Agent, or Firm—McDermott Will & Emery LLP

(57) ABSTRACT

A semiconductor memory device includes a bit line precharge voltage generator, a bit line precharge circuit, a voltage drop circuit, and a voltage supply driver. The bit line precharge voltage generator generates a bit line precharge voltage. The bit line precharge circuit precharges a bit line. The voltage drop circuit drops a voltage level of the bit line precharge voltage in a standby mode to generate a low precharge voltage and provides the low precharge voltage to the bit line precharge circuit. The voltage supply driver provides the bit line precharge voltage to the bit line precharge circuit in an active mode.

6 Claims, 4 Drawing Sheets

SEMICONDUCTOR MEMORY DEVICE

CROSS-REFERENCE TO RELATED APPLICATION

The present invention claims priority of Korean patent application number 10-2006-0096527, filed on Sep. 29, 2006, which is incorporated by reference in its entirety.

BACKGROUND OF THE INVENTION

The present invention relates to semiconductor design technologies; and, more particularly, to a bleeder circuit for use in the semiconductor memory device.

In recent semiconductor memory devices, a large memory capacity and a high operation speed are rising as the biggest issue. In addition to these requirements, development for low power semiconductor memory device is required to ensure a reliable operation under low power environments. Especially, it is a recent development trend that memories mounted on portable systems such as a portable phone for mobile communications, a notebook computer and the like should be made to consume a minimum power.

One of these efforts is a technique of minimizing current consumption in a core region of memory. The core region consisting of memory cells, bit lines and word lines, is designed according to the strict design rule. Thus, the memory cells are very small in size and also use a low power.

In particular, the precharge of a bit line is one of important techniques related to a speed in an access to cell data. That is, the precharge of the bit line is a technique that precharges the bit line to a certain voltage level in advance before the data access to rapidly do so.

Under the environment, the memory cell has a mesh type in which a plurality of word lines and a plurality of bit lines intersect each other. In this structure, gate residue occurs due to any problem in the manufacturing process of the word line and bit line, which in turn gives rise to a bridge phenomenon.

This bridge causes a short circuit of the word line and bit line.

FIG. 1 is a circuit diagram showing a short circuit of a word line and a bit line.

Referring to FIG. 1, it can be seen that the short circuit occurs due to a bridge phenomenon between the word line and the bit line.

This situation causes a leakage phenomenon (leakage path) which passes a precharge voltage VBLP that is a voltage for precharging the bit line in a standby state through the short circuit and then gets to the ground of a word line driver 103.

This defect in the process increases the power consumption of the semiconductor memory device, thereby reducing power efficiency and deteriorating the performance of products.

In order to solve such a defect in the process, a bleeder circuit has been proposed.

FIG. 2 is a circuit diagram illustrating a conventional bleeder circuit.

Referring to FIG. 2, a bleeder circuit 202 is a bleeder transistor which is arranged in a sub hole area where a word line array and a bit line sense amplifier array intersect each other.

At this time, a booster voltage VPP is always biased to the gate of the bleeder transistor to supply a bit line precharge voltage VBLP to a bit line precharge section 201. And, the bleeder transistor is an NMOS transistor N3 with a large resistance by its long gate.

That is, the bleeder circuit 202 connects the bit line precharge voltage VBLP to the bit line precharge section 201 through the bleeder transistor N3, rather than directly connecting thereto, thereby inducing a reduction in current by an increase in resistance.

Further, a bleed voltage VBLEED created by the bleeder circuit 202 is used as a precharge voltage for precharging a bit line in both an active operation (active mode) and a standby operation (standby mode) of the semiconductor memory device.

However, in case of precharging the bit line with the bleed voltage VBLEED created by drop of the bit line precharge voltage VBLP by a certain voltage, precharge characteristic of the bit line is degraded due to reduction in drivability.

This phenomenon happens frequently, especially in the active operation of the semiconductor memory device, and sensing capability of the bit line sense amplifier is also lowered by degradation of precharge characteristic of the bit line.

SUMMARY OF THE INVENTION

Embodiments of the present invention are directed to providing a semiconductor memory device for improving a performance of a bit line precharge operation.

In accordance with an aspect of the present invention, there is provided a semiconductor memory device including a bit line precharge voltage generator, a bit line precharge circuit, a voltage drop circuit and a voltage supply driver. The bit line precharge voltage generator generates a bit line precharge voltage. The bit line precharge circuit precharges a bit line. The voltage drop circuit drops a voltage level of the bit line precharge voltage in a standby mode to generate a low precharge voltage and provides the low precharge voltage to the bit line precharge circuit. The voltage supply driver provides the bit line precharge voltage to the bit line precharge circuit in an active mode.

In accordance with another aspect of the present invention, there is provided a semiconductor memory device including a bit line precharge voltage generator, a bit line precharge circuit, and a bit line precharge voltage transmission unit. The bit line precharge voltage generator generates a bit line precharge voltage. The bit line precharge circuit precharges a bit line. The bit line precharge voltage transmission unit transmits the bit line precharge voltage to the bit line precharge circuit. The precharge voltage has the different voltage level for an active mode and a standby mode.

DESCRIPTION OF SPECIFIC EMBODIMENTS

Hereinafter, a preferred embodiment of the present invention will be set forth in detail with reference to the accompanying drawings so that the invention can be easily carried out by those skilled in the art to which the invention pertains.

Figure 1:
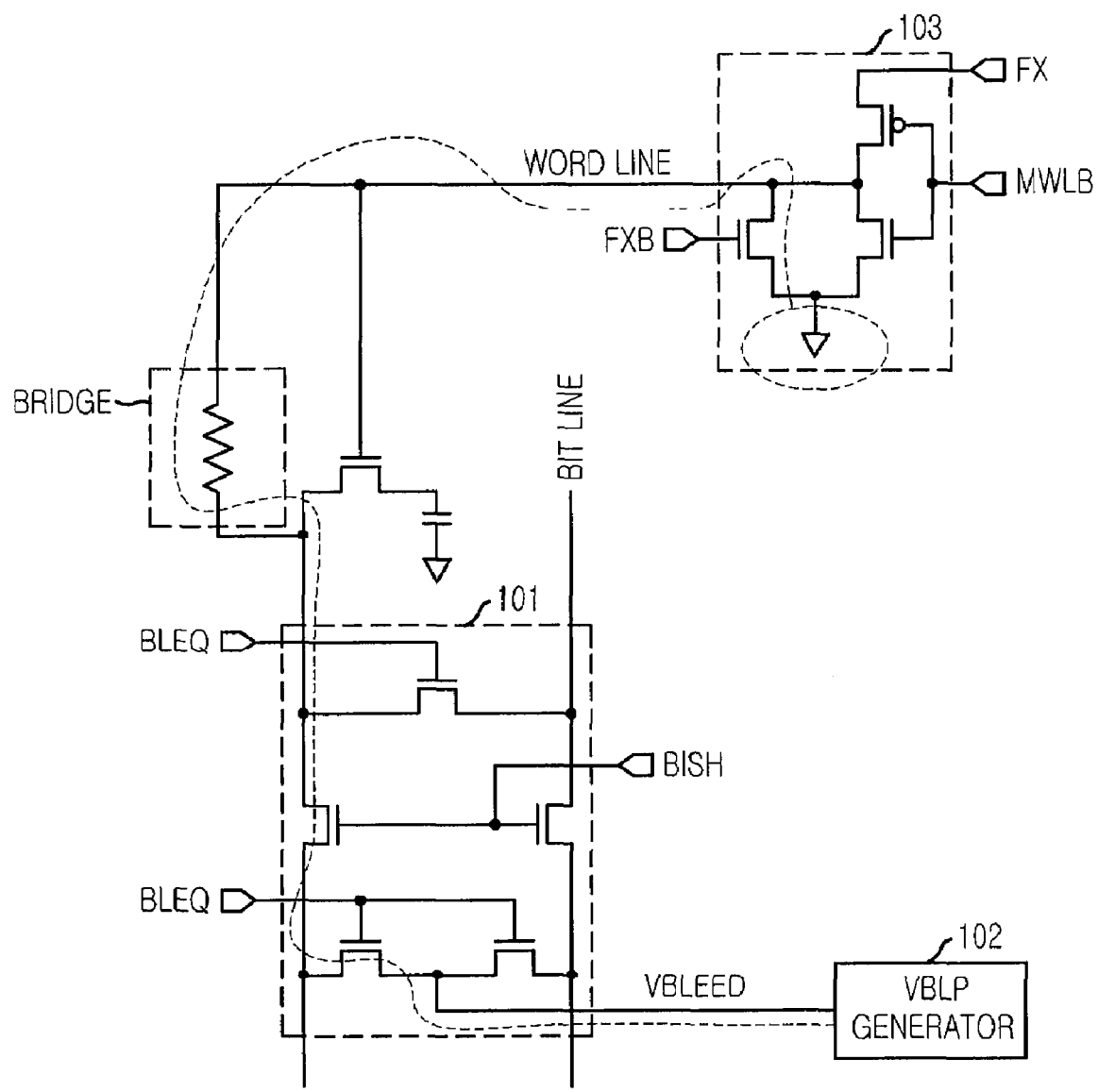
FIG. 1 is a circuit diagram showing a short circuit of a word line and a bit line.
Figure 2:
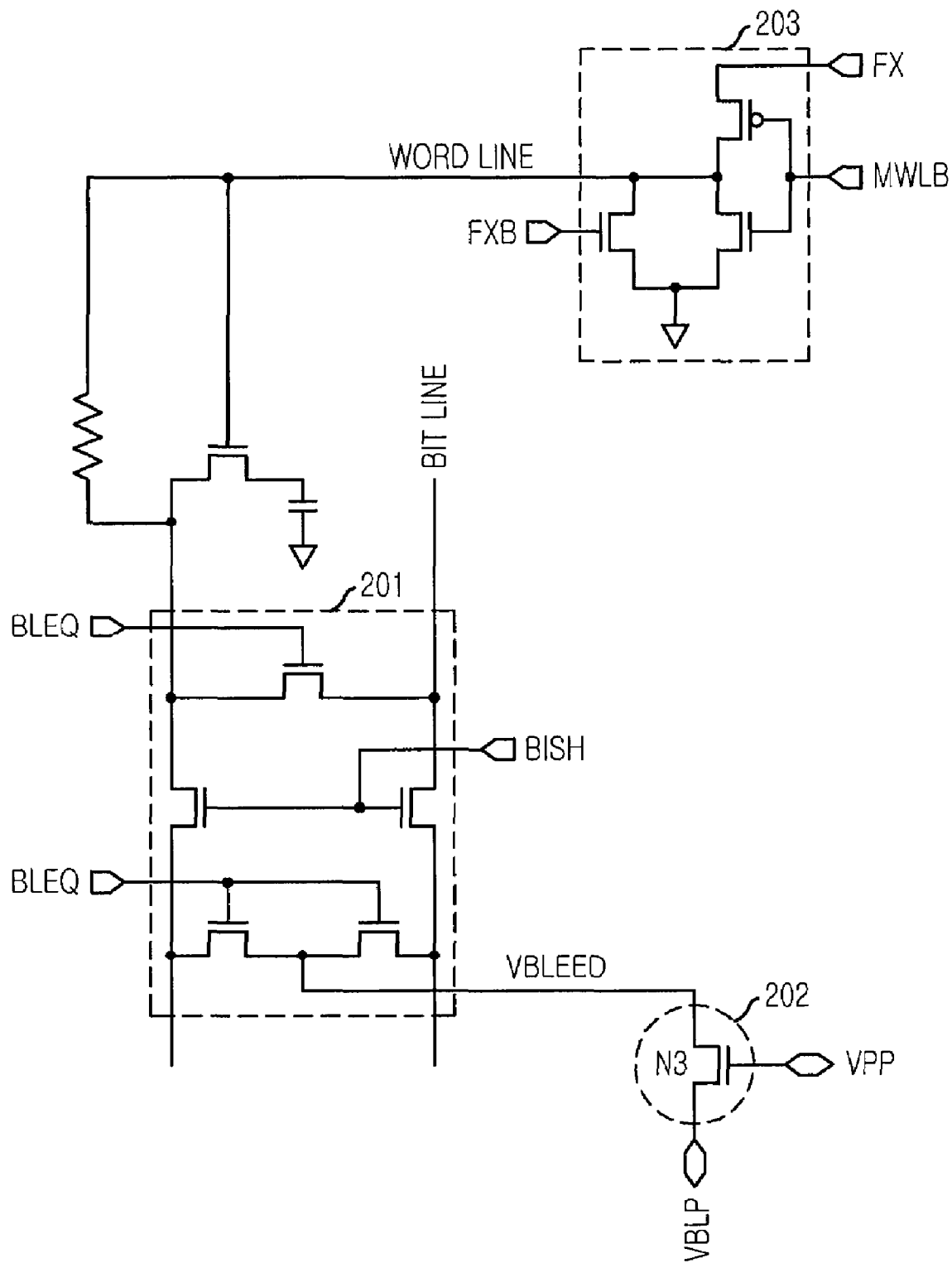
FIG. 2 is a circuit diagram illustrating a conventional bleeder circuit.
Figure 3:
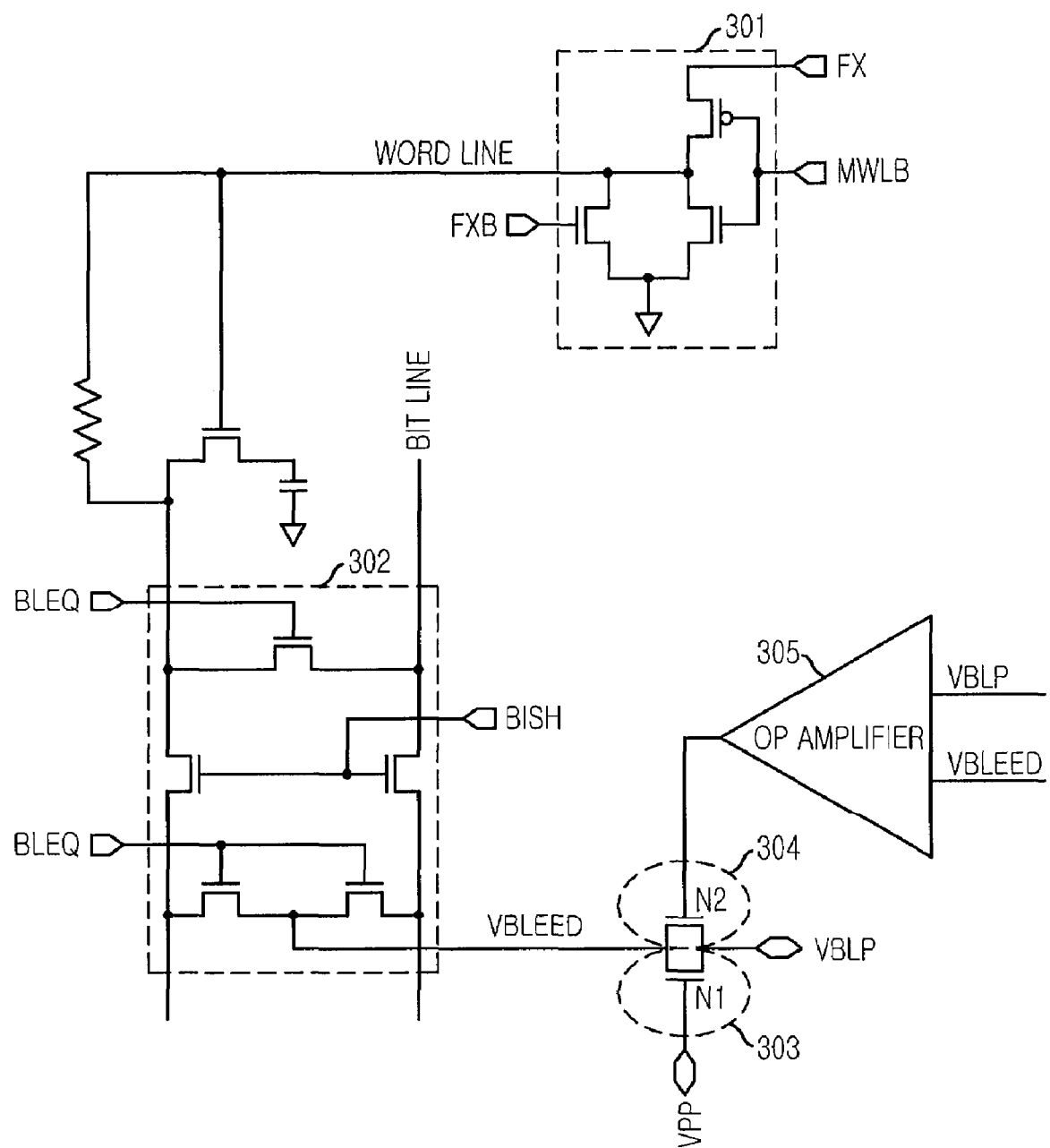
FIG. 3 is a conceptual diagram illustrating a bleeder circuit in accordance with a preferred embodiment of the present invention.

FIG. 3 is a conceptual diagram illustrating a bleeder circuit in accordance with a preferred embodiment of the present invention.

Referring to FIG. 3, the bleeder circuit of the invention includes a precharge voltage generator (not shown) for dividing a core voltage VCORE to generate a bit line precharge voltage VBLP, a voltage drop circuit 303 for voltage-dropping the bit line precharge voltage VBLP when there occurs a leakage current due to a bridge of a word line and a bit line to transfer the same to a bit line precharge circuit 302, a voltage transfer driver 304 for raising the level of a bleed voltage VBLEED by the bit line precharge voltage VBLP to improve the precharge characteristic of the bit line in an active operation of the semiconductor memory device, and a controller 305 for controlling the operation of the voltage transfer driver 304. In FIG. 3, a reference numeral 301 denotes a word line driver.

Now, details of each of these components will be given as follows.

The voltage drop circuit 303 is an NMOS bleeder transistor N1 which drops the bit line precharge voltage VBLP by receiving a booster voltage VPP via its gate to output a dropped voltage as the bleed voltage VBLEED. The bleed voltage VBLEED is then forwarded to the bit line precharge circuit 302.

The NMOS bleeder transistor N1 is manufactured by making the length of its gate longer. This is to drop the level of the bit line precharge voltage VBLP.

Further, the voltage drop circuit 303 is continuously operated in both the active operation and the standby operation, which becomes a main cause that degrades the precharge characteristic of the bit line.

Thereafter, the voltage transfer driver 304 transfers the bit line precharge voltage VBLP to the bit line precharge circuit 302 in order to improve the precharge characteristic of the bit line in the active operation. This can be implemented by using an NMOS transistor N2 taking an output signal of the controller 305 as its gate input.

At this time, the NMOS transistor N2 is manufactured by setting its gate length shorter. This is to maintain the level of the bit line precharge voltage VBLP and transfer the same to the bit line precharge circuit 302.

Here, the connection relation of the NMOS transistors N1 and N2 constituting the voltage drop circuit 303 and the voltage transfer driver 304 is such that the drains of N1 and N2 are connected to the bit line precharge voltage generator and the sources thereof are connected to the bit line precharge circuit 302, in the state that the drains of N1 and N2 are connected to each other and the sources thereof are connected to each other.

Thus, in the active operation, the bit line precharge voltage VBLP is dropped by the voltage drop circuit 303 and transferred to the bit line precharge circuit 302. However, it is transferred by the voltage transfer driver 304 without being dropped, thereby decreasing a voltage drop amount by the voltage drop circuit 303.

Next, the controller 305 can be implemented by using an operational (OP) amplifier which compares the bit line precharge voltage VBLP with the bleed voltage VBLEED that is an output voltage of the voltage drop circuit 303.

An output signal of the OP amplifier 305 is used as a gate input signal of the voltage transfer driver 304.

The following is a description for an inner configuration of the OP amplifier 305.

Figure 4:
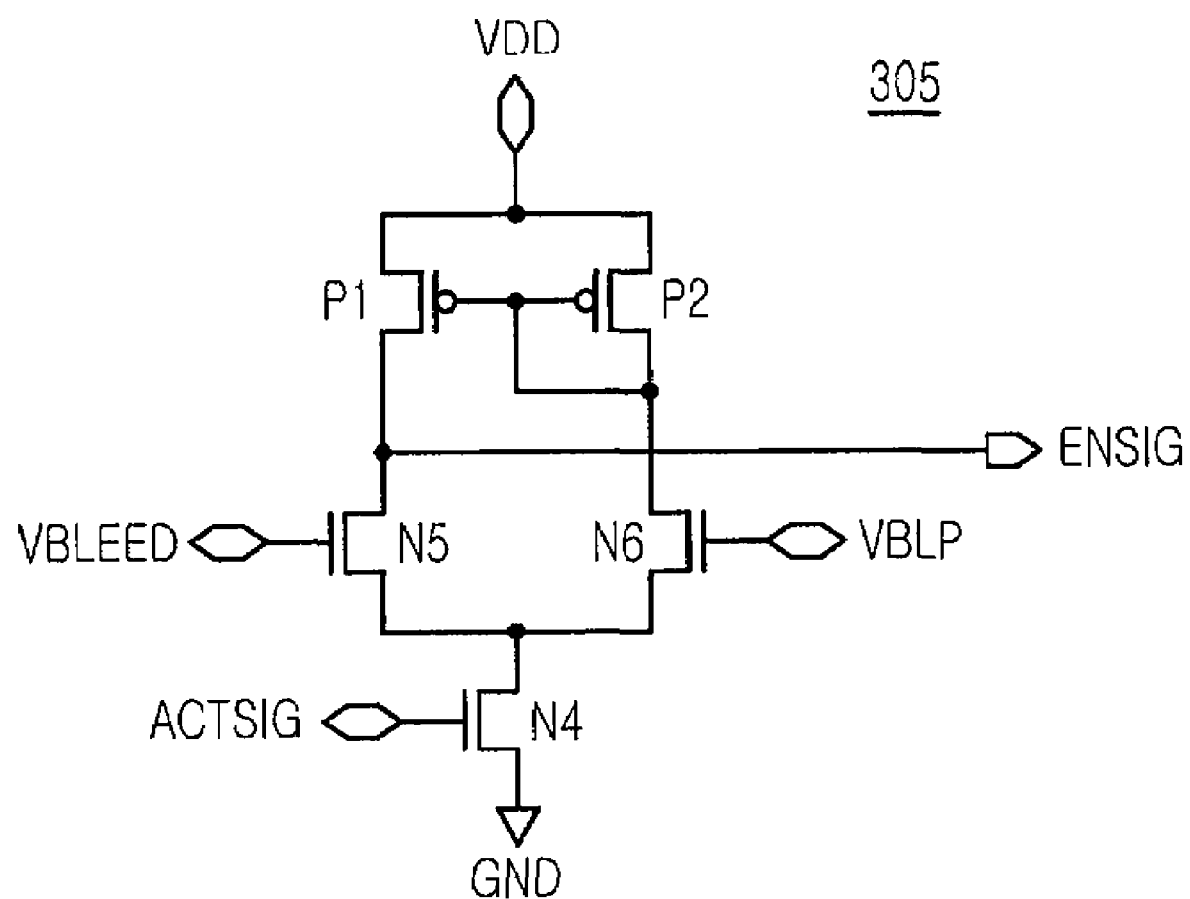
FIG. 4 illustrates a detailed circuit diagram of an operational amplifier shown in FIG. 3.

FIG. 4 illustrates a detailed circuit diagram of the OP amplifier 305 shown in FIG. 3.

Referring to FIG. 4, the OP amplifier 305 employs a general differential comparator circuit which can be embodied by an NMOS transistor N4 connected to a ground voltage VSS and whose gate receives an active mode signal ACTSIG representing an active operation, two PMOS transistors P1 and P2 which are connected to a power supply voltage VDD and constitute a current mirror having gates engaging with each other, NMOS transistors N5 and N6 connected between the PMOS transistors P1 and P2 and a bias NMOS transistor N4 and whose gates receive the bleed voltage VBLEED and the bit line precharge voltage VBLP as their differential inputs, respectively.

By this OP amplifier 305, the voltage level of the bleed voltage VBLEED is compared with that of the bit line precharge voltage VBLP. If the voltage level of the bleed voltage VBLEED is lower than that of the bit line precharge voltage VBLP, an enable signal ENSIG of the voltage transfer driver 304 is activated for driving thereof.

Thus, the voltage level of the bleed voltage VBLEED becomes equal to that of the bit line precharge voltage VBLP (where a threshold Vt of the voltage transfer driver 304 is neglected), which improves the precharge characteristic of the bit line in the active operation.

To sum up, the voltage drop transistor has been used to reduce an amount of leakage current that occurs due to a bridge of the word line and the bit line in the standby operation, and is also used in the active operation, thereby deteriorating the precharge characteristic of the bit line.

For this, the present invention is provided with the bit line precharge voltage VBLP transfer driver 304 which operates only in the active operation along with the voltage drop transistor 303. Through this, the present invention precharges the bit line with the bit line precharge voltage VBLP in the active operation, and precharges the bit line with the bleed voltage VBLEED voltage-dropped from the bit line precharge voltage VBLP in the standby operation.

Although the types and arrangements of logic gates in the preferred embodiment set forth above are illustrated with respect to the case the input and output signals used therein are all high active signals, it should be noted that these logic gates may be implemented in different types and arrangements based on the active polarities of the input and output signals.

As described above, the present invention can decrease the amount of leakage current by the bit line precharge voltage in the standby mode by using the voltage drop circuit. Accordingly, it is possible to decrease the overall amount of current consumption of the semiconductor memory device, which can reduce the overall amount of power consumption.

In addition, the present invention precharges the bit line through the voltage transfer driver in the active mode, thereby improving the precharge characteristic of the bit line.

As a result, the present invention can reduce the operation time of the semiconductor memory device and thus induce a stable operation even under the radio frequency environment.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a bit line precharge voltage generator for generating a bit line precharge voltage;
   a bit line precharge circuit for precharging a bit line;
   a voltage drop circuit for dropping a voltage level of the bit line precharge voltage in a standby mode to generate a low precharge voltage and providing the low precharge voltage to the bit line precharge circuit;

a voltage supply driver for providing the bit line precharge voltage to the bit line precharge circuit in an active mode; and a controller for comparing an output voltage of the voltage drop circuit with the bit line precharge voltage, and controlling the voltage supply driver to provide the bit line precharge voltage to the bit line precharge circuit in the active mode based on a result of the comparison; and a voltage supply driver for providing the bit line precharge voltage to the bit line precharge circuit in an active mode.

2. The semiconductor memory device as recited in claim 1, wherein the voltage drop circuit is also operated in the active mode.

3. The semiconductor memory device as recited in claim 1, wherein the voltage supply driver is provided with a first NMOS transistor and the voltage drop circuit is provided with a second NMOS transistor.

4. The semiconductor memory device as recited in claim 3, wherein the gate length of the first NMOS transistor is shorter than that of the second NMOS transistor.

5. The semiconductor memory device as recited in claim 1, wherein the controller includes:

a third NMOS transistor connected to a ground voltage and whose gate takes an active mode signal representing the active mode;

a first and a second PMOS transistors which are connected to a power supply voltage and constitute a current mirror having gates engaging with each other;

a fourth NMOS transistor connected between the first PMOS transistor and the third NMOS transistor and whose gate receives an output voltage of the voltage drop circuit;

a fifth NMOS transistor connected between the second PMOS transistor and the third NMOS transistor and whose gate receives the bit line precharge voltage; and an output end arranged between the first PMOS transistor and the fourth NMOS transistor.

6. The semiconductor memory device as recited in claim 4, wherein the source and drain of the first NMOS transistor are connected with those of the second NMOS transistor, respectively.

* * * * *